United States Patent
Tien et al.

(10) Patent No.: US 11,171,052 B2
(45) Date of Patent: Nov. 9, 2021

(54) METHODS OF FORMING INTERCONNECT STRUCTURES WITH SELECTIVELY DEPOSITED PILLARS AND STRUCTURES FORMED THEREBY

(71) Applicant: Taiwan Semiconductor Manufacturing Co., Ltd., Hsinchu (TW)

(72) Inventors: Hsi-Wen Tien, Xinfeng Township, Hsinchu County (TW); Wei-Hao Liao, Taichung (TW); Pin-Ren Dai, New Taipei (TW); Chih-Wei Lu, Hsinchu (TW); Chung-Ju Lee, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/396,965

(22) Filed: Apr. 29, 2019

(65) Prior Publication Data
US 2020/0343137 A1    Oct. 29, 2020

(51) Int. Cl.
*H01L 21/768* (2006.01)
*H01L 23/528* (2006.01)
*H01L 21/311* (2006.01)

(52) U.S. Cl.
CPC .. *H01L 21/76885* (2013.01); *H01L 21/31116* (2013.01); *H01L 21/31144* (2013.01); *H01L 21/76802* (2013.01); *H01L 21/76837* (2013.01); *H01L 21/76877* (2013.01); *H01L 23/5283* (2013.01)

(58) Field of Classification Search
CPC ......... H01L 21/76885; H01L 21/31116; H01L 23/5283; H01L 21/76837; H01L 21/76802; H01L 21/76877; H01L 21/31144; H01L 21/76879; H01L 21/76804

See application file for complete search history.

(56) References Cited

U.S. PATENT DOCUMENTS

| | | |
|---|---|---|
| 7,101,790 B2 | 9/2006 | Lee et al. |
| 8,895,431 B2 | 11/2014 | Harada et al. |
| 9,484,257 B2 | 11/2016 | Yao et al. |
| 9,859,150 B2 | 1/2018 | Jung |
| 2004/0203223 A1 | 10/2004 | Guo et al. |
| 2005/0124149 A1 | 6/2005 | Kim et al. |
| 2006/0270068 A1 | 11/2006 | Lo |

(Continued)

OTHER PUBLICATIONS

Non-Final Office Action dated Jul. 30, 2020, issued in U.S. Appl. No. 16/413,906.

*Primary Examiner* — Hoang-Quan Ho
(74) *Attorney, Agent, or Firm* — McClure, Qualey & Rodack, LLP

(57) ABSTRACT

A method of forming an interconnect structure for an integrated circuit device is provided. The method includes forming a conductive line layer over a semiconductor substrate. The conductive line layer includes a metal line. The method also includes forming a conductive pillar on and in contact with the metal line. The method further includes depositing a dielectric layer over the conductive line layer to cover the conductive pillar, and etching the dielectric layer to form a trench. The conductive pillar is exposed through the trench. In addition, the method includes filling the trench with a conductive material to form a conductive line.

20 Claims, 13 Drawing Sheets

(56) References Cited

U.S. PATENT DOCUMENTS

| | | | |
|---|---|---|---|
| 2007/0020829 A1* | 1/2007 | Hotta | H01L 21/76895 |
| | | | 438/172 |
| 2007/0037384 A1* | 2/2007 | Su | H01L 23/5283 |
| | | | 438/637 |
| 2007/0123036 A1 | 5/2007 | Brakensiek et al. | |
| 2009/0166881 A1* | 7/2009 | Balakrishnan | H01L 23/53295 |
| | | | 257/774 |
| 2014/0125421 A1* | 5/2014 | Miyazaki | H01L 23/5228 |
| | | | 331/111 |
| 2014/0175617 A1 | 6/2014 | Antonelli et al. | |
| 2014/0264947 A1 | 9/2014 | Lin et al. | |
| 2017/0018458 A1 | 1/2017 | Cheng et al. | |
| 2018/0033866 A1* | 2/2018 | Liao | H01L 29/42376 |

* cited by examiner

METHODS OF FORMING INTERCONNECT STRUCTURES WITH SELECTIVELY DEPOSITED PILLARS AND STRUCTURES FORMED THEREBY

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also increased the complexity of processing and manufacturing ICs.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-2, 1B-2, 1C-2, 1D-2, 1E-2, 1F-2, 1G-2, 1H-2, 1I-2 and 1J-2 show top views of structures at various stages of an exemplary method for fabricating an interconnect structure with selectively deposited pillars for an integrated circuit device, in accordance with some embodiments.

FIG. 2 shows a cross-sectional view of an integrated circuit device with selectively deposited pillars in an interconnect structure, in accordance with some embodiments.

DETAILED DESCRIPTION

Figures 1, 1A:
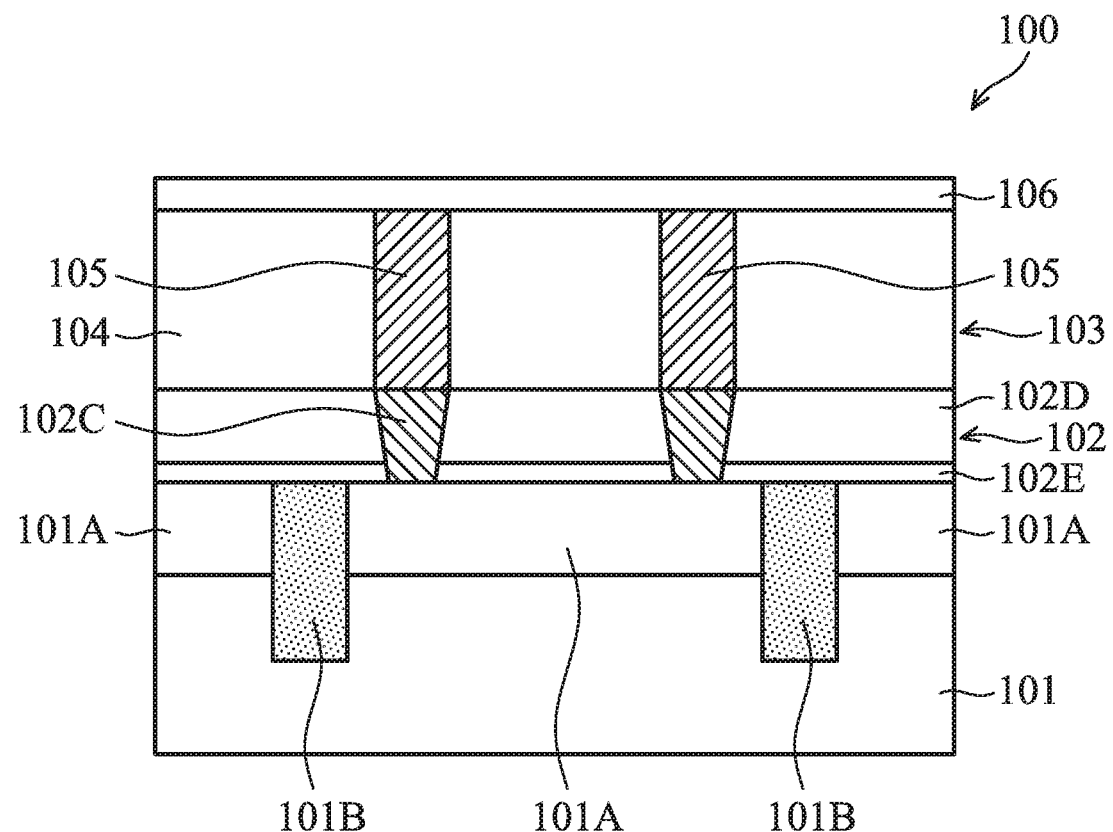
FIGS. 1A-1, 1B-1, 1C-1, 1D-1, 1E-1, 1F-1, 1G-1, 1H-1, 1I-1, 1J-1 and 1K show cross-sectional views of structures at various stages of an exemplary method for fabricating an interconnect structure with selectively deposited pillars for an integrated circuit device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "under," "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein relate generally to fabricating interconnect structures for integrated circuit devices. The interconnect structures are fabricated using selectively deposited conductive pillars to replace vias to avoid via overlay shift issue. The conductive pillars of the embodiments of the disclosure are selectively deposited in openings of a disposable material layer such as a bottom anti-reflective coating (BARC) layer. Afterwards, the BARC layer is removed and a dielectric layer is deposited to cover the conductive pillars. Next, the dielectric layer is etched to form a trench above the conductive pillars, and then the trench is filled with a conductive material to form a conductive line that is in contact with the conductive pillars. The combination of the conductive line and the conductive pillars of the embodiments of the disclosure has a profile that is similar to the profile of an interconnect structure formed by a dual damascene process.

In some embodiments, the conductive pillars of the embodiments of the disclosure are formed in a middle-end-of-line (MEOL) process for a semiconductor device. The semiconductor device is for example Fin Field Effect Transistor (FinFET), planar FET, π-gate FET, Ω-gate FET, Gate-All-Around (GAA) FET, complementary metal-oxide-semiconductor (CMOS) image sensor, or another semiconductor device. The conductive pillars are electrically connected to the contacts of a source region, a drain region and a gate electrode, respectively, in the semiconductor device. Afterwards, the conductive line is formed on and in contact with the conductive pillars. The conductive line and the conductive pillars are embedded in the same dielectric layer to be a lower interconnect layer of an interconnect structure for an integrated circuit device. The lower interconnect layer may further include multiple metal lines that are in contact with multiple vias.

In some embodiments, the conductive pillars of the embodiments of the disclosure are formed in a back-end-of-line (BEOL) process for an integrated circuit device. The integrated circuit device includes various active components and passive components. The active components may be photodiodes, planar FETs, FinFETs or other transistors. The passive components are, for example, resistors, capacitors, and inductors. The active components and the passive components of the integrated circuit device are electrically coupled through an interconnect structure. The conductive pillars may be electrically connected to metal lines of an underlying interconnect layer and a conductive line is formed on and in contact with the conductive pillars to form an upper interconnect layer of the interconnect structure for the integrated circuit device. The interconnect structure may further include an additional interconnect layer disposed under or above the interconnect layer that includes the conductive pillars of the embodiments of the disclosure. Moreover, the additional interconnect layer can also include the conductive pillars of the embodiments of the disclosure.

According to the embodiments of disclosure, the formation of the selectively deposited conductive pillars for the interconnect structure can prevent from via overlay shift issue and avoid damage in the dielectric material. Moreover, the trench gap filling capability for forming the conductive line on the conductive pillars is improved. Therefore, the interconnect structures with the conductive pillars are suitable for small via critical dimension (CD) and small conductive line pitch. According to the benefits mentioned above, the embodiments of the disclosure are applicable for integrated circuit devices at technology nodes of 20 nm (N20), 16 nm (N16), 10 nm (N10), 7 nm (N7), 5 nm (N5), 3 nm (N3) and beyond.

The foregoing broadly outlines some aspects of the embodiments described herein. Some embodiments described herein are described in the context of interconnect structures for integrated circuit devices. Some variations of the exemplary methods and structures are described. A person having ordinary skill in the art will readily understand other modifications may be made that are contemplated within the scope of other embodiments. Although embodiments of the method may be described in a particular order, various other embodiments of the method may be performed in any logical order and may include fewer or more steps than what is described herein.

Figures 1, 1A, 2:
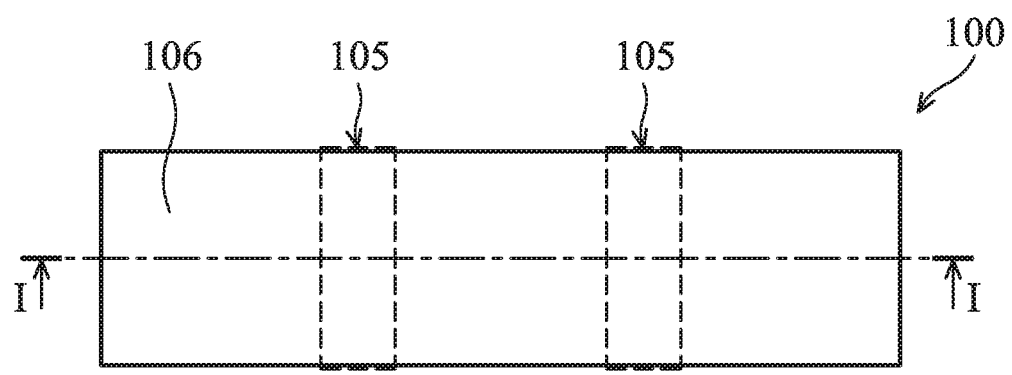
Figures 1, 1B:
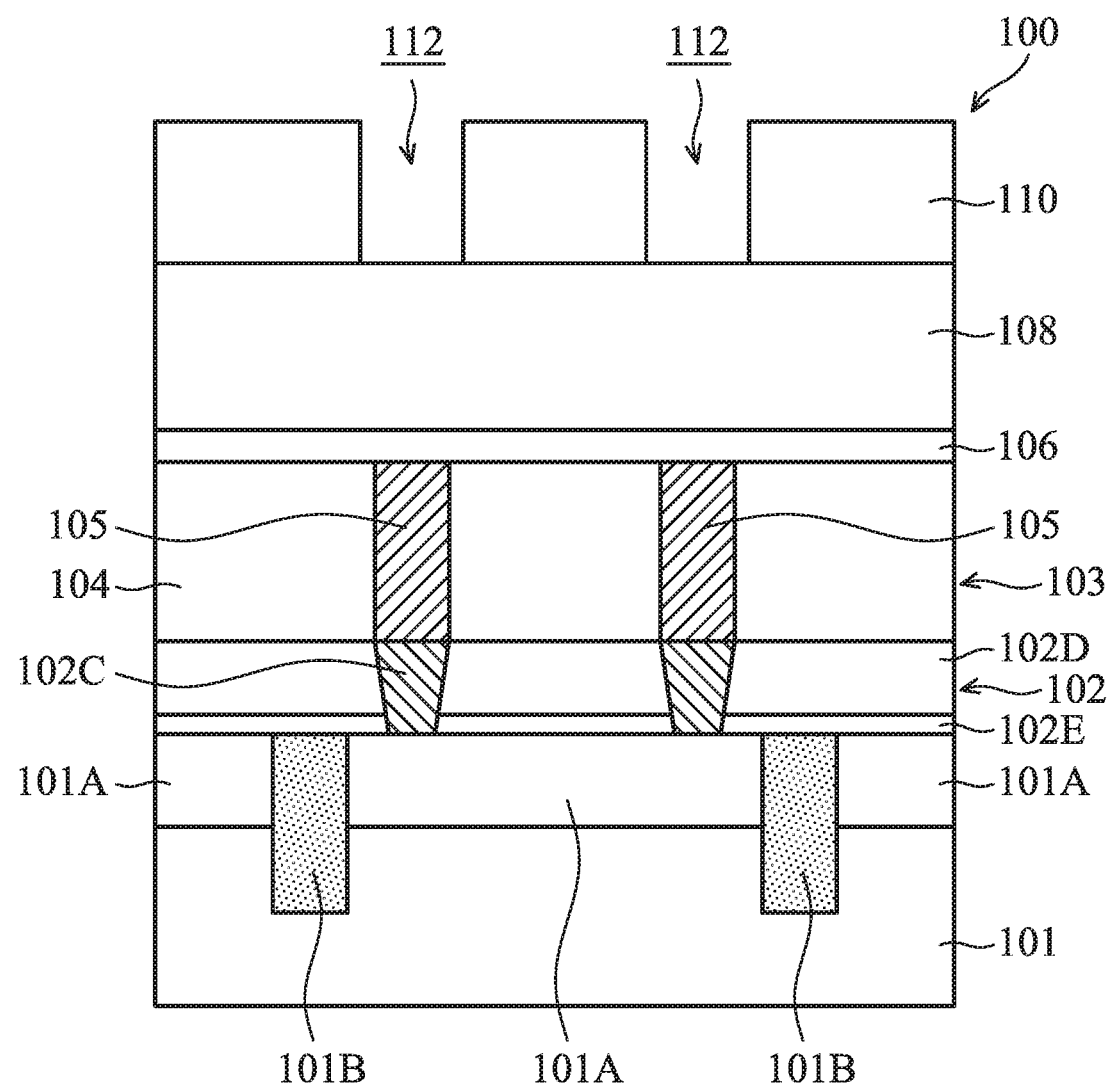
Figures 1, 1B, 2:
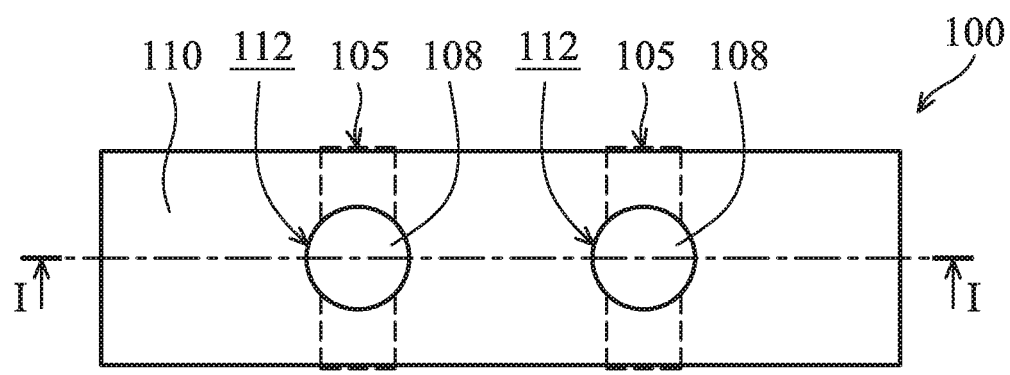
Figures 1, 1C:
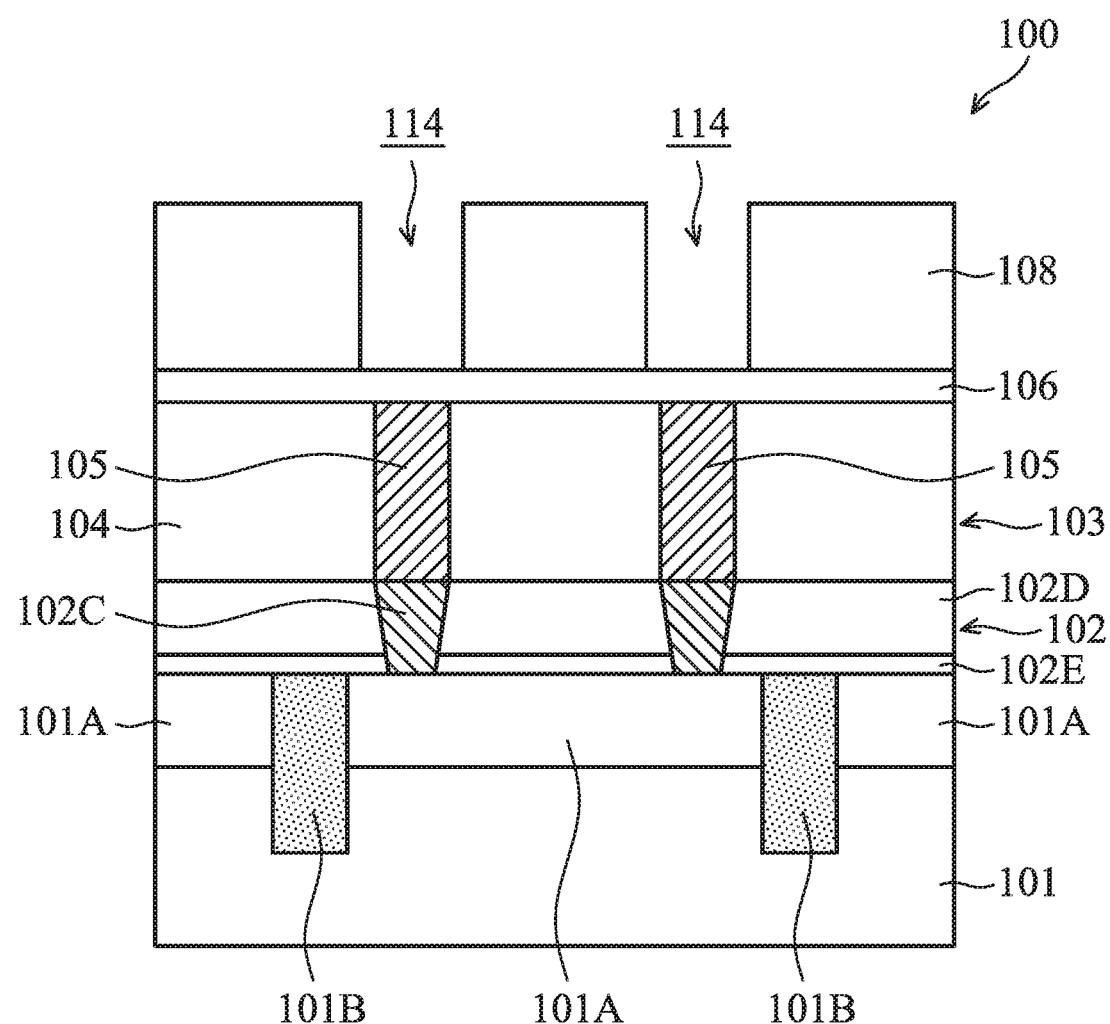
Figures 1, 1C, 2:
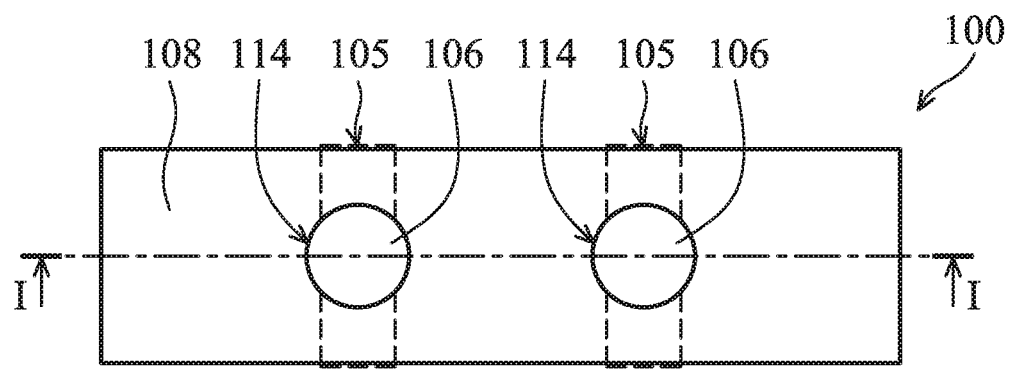
Figures 1, 1D:
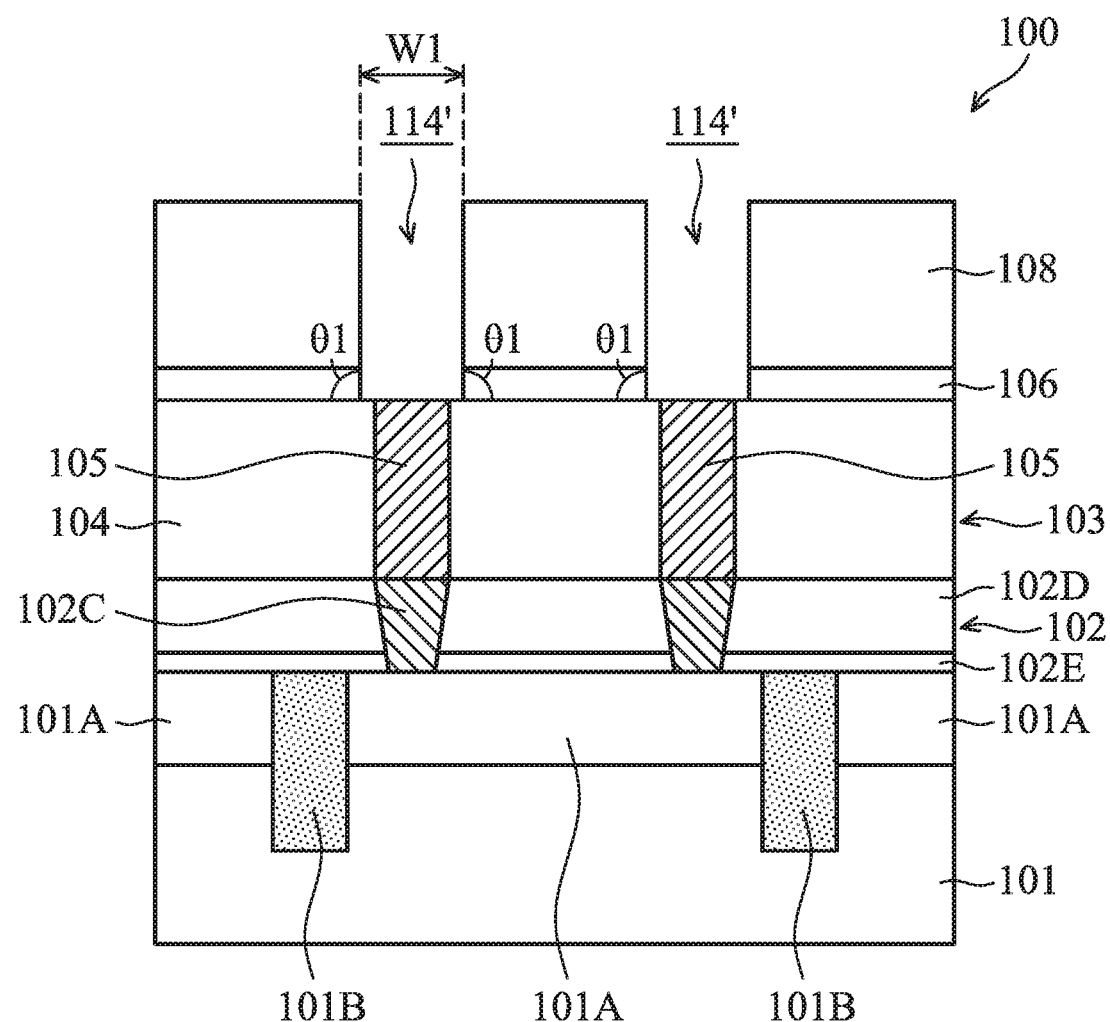
Figures 1, 1D, 2:
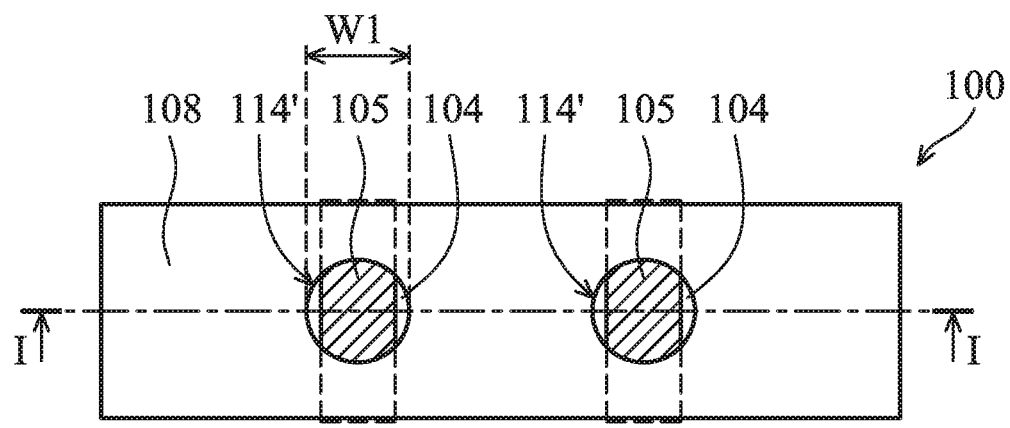
Figures 1, 1E:
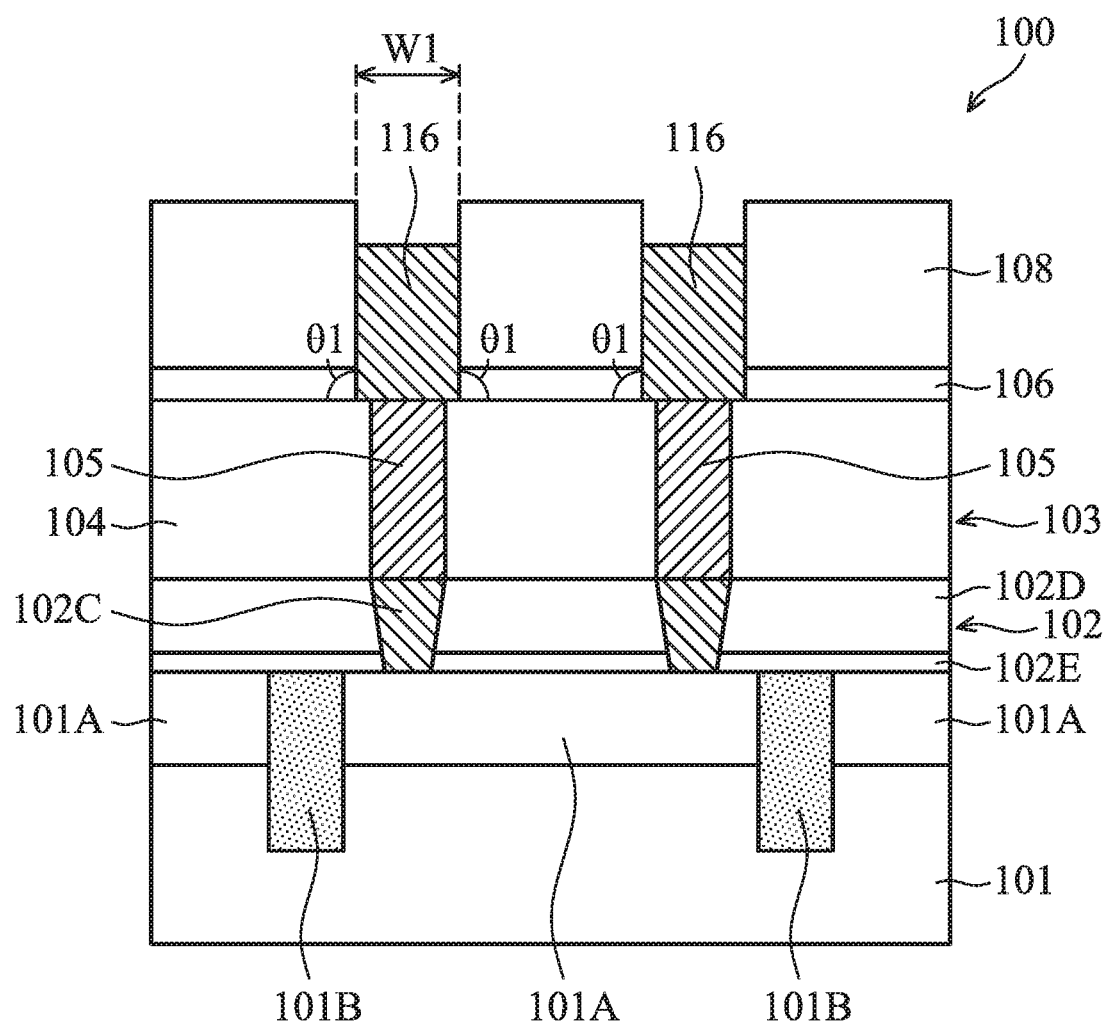
Figures 1, 1E, 2:
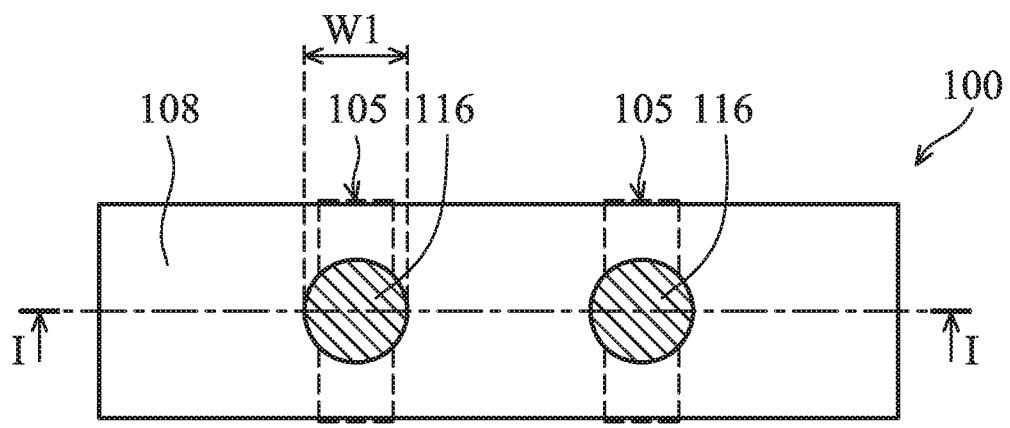
Figures 1, 1F:
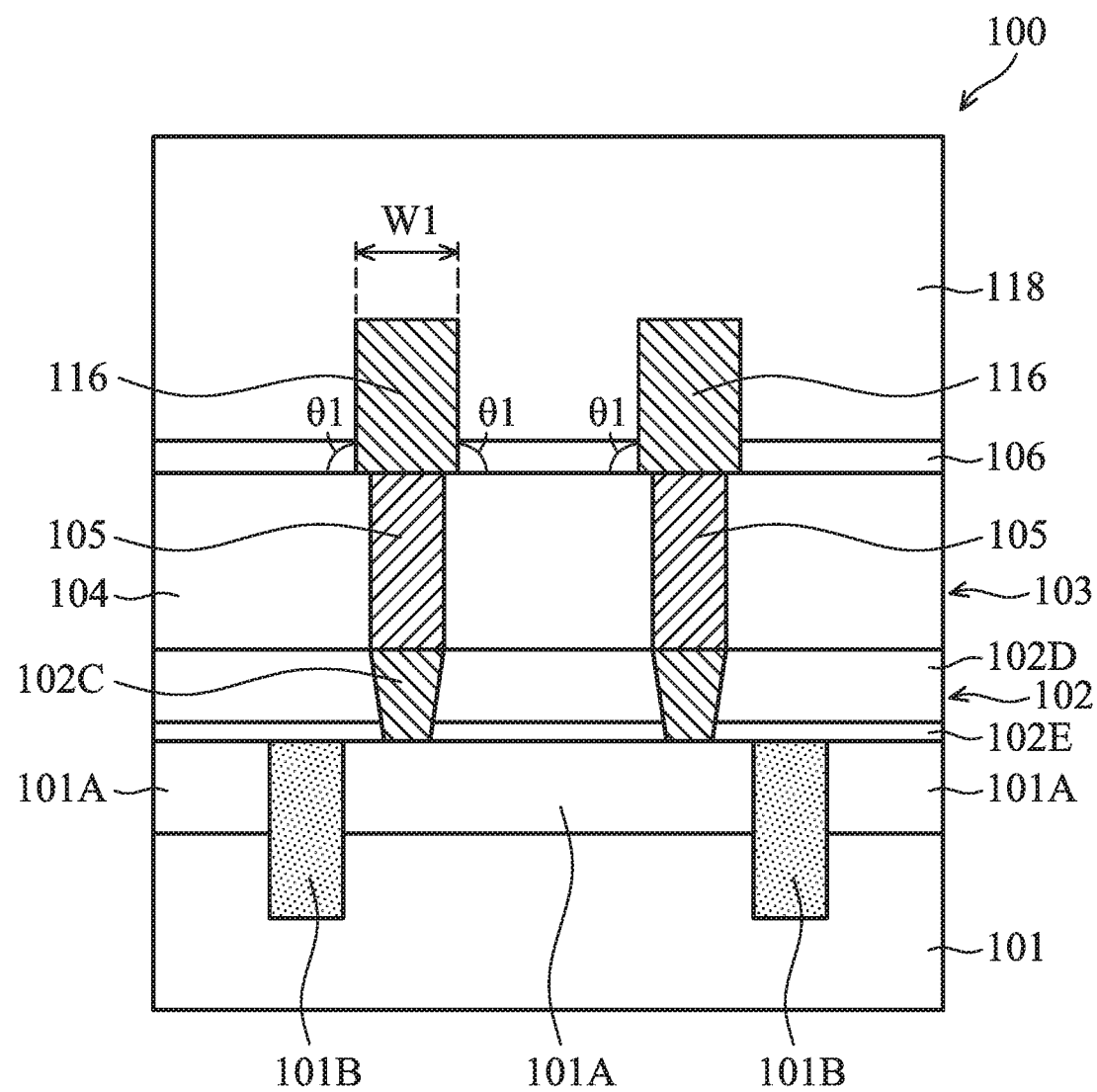
Figures 1, 1F, 2:
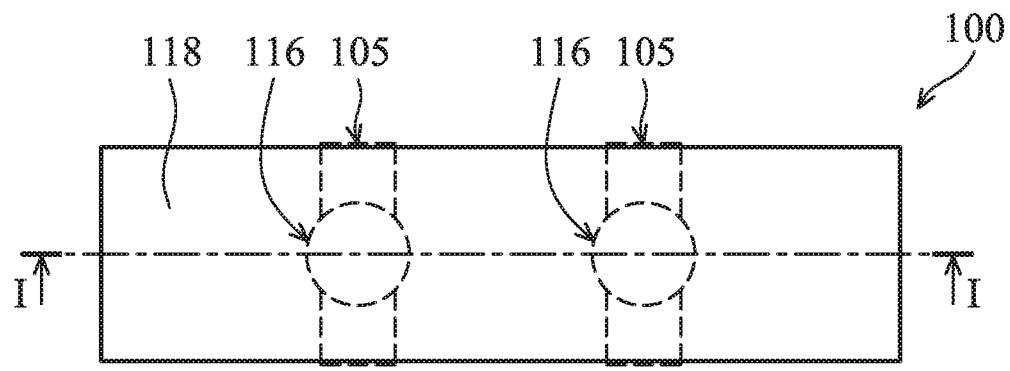
Figures 1, 1G:
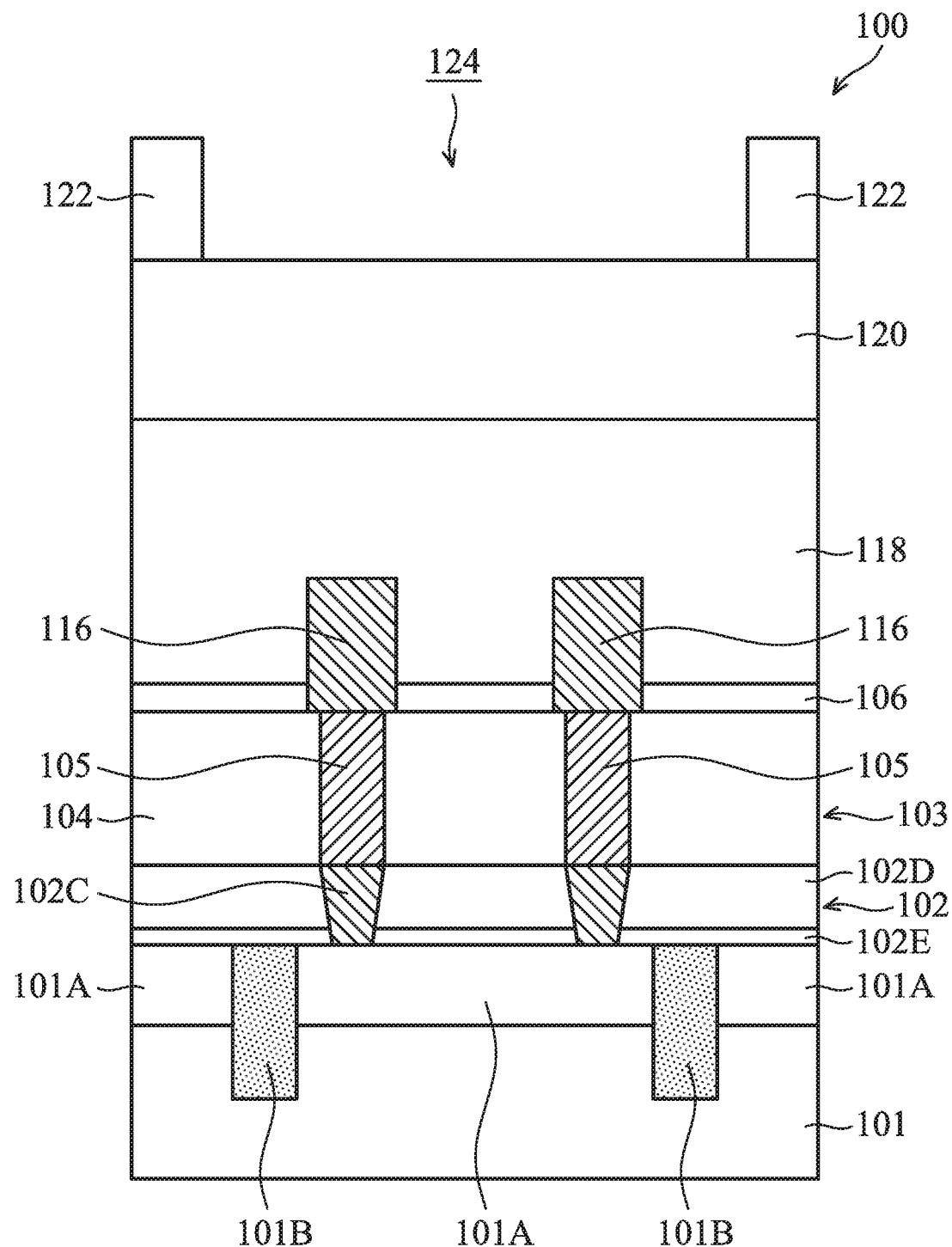
Figures 1, 1G, 2:
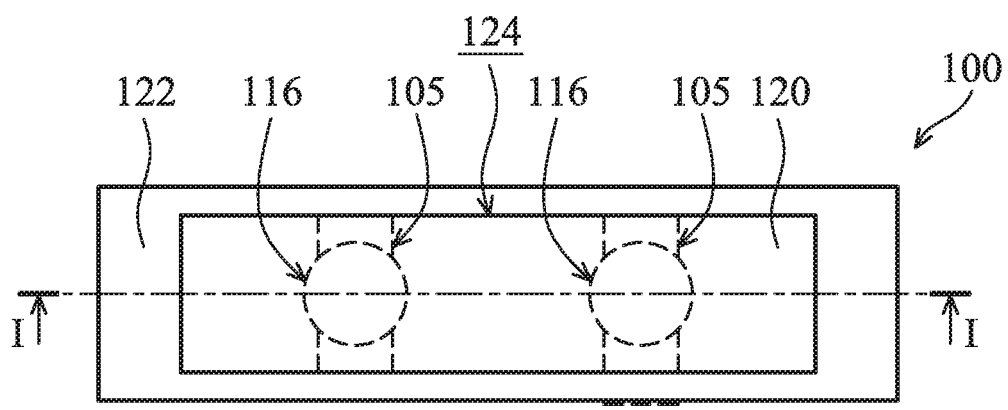
Figures 1, 1H:
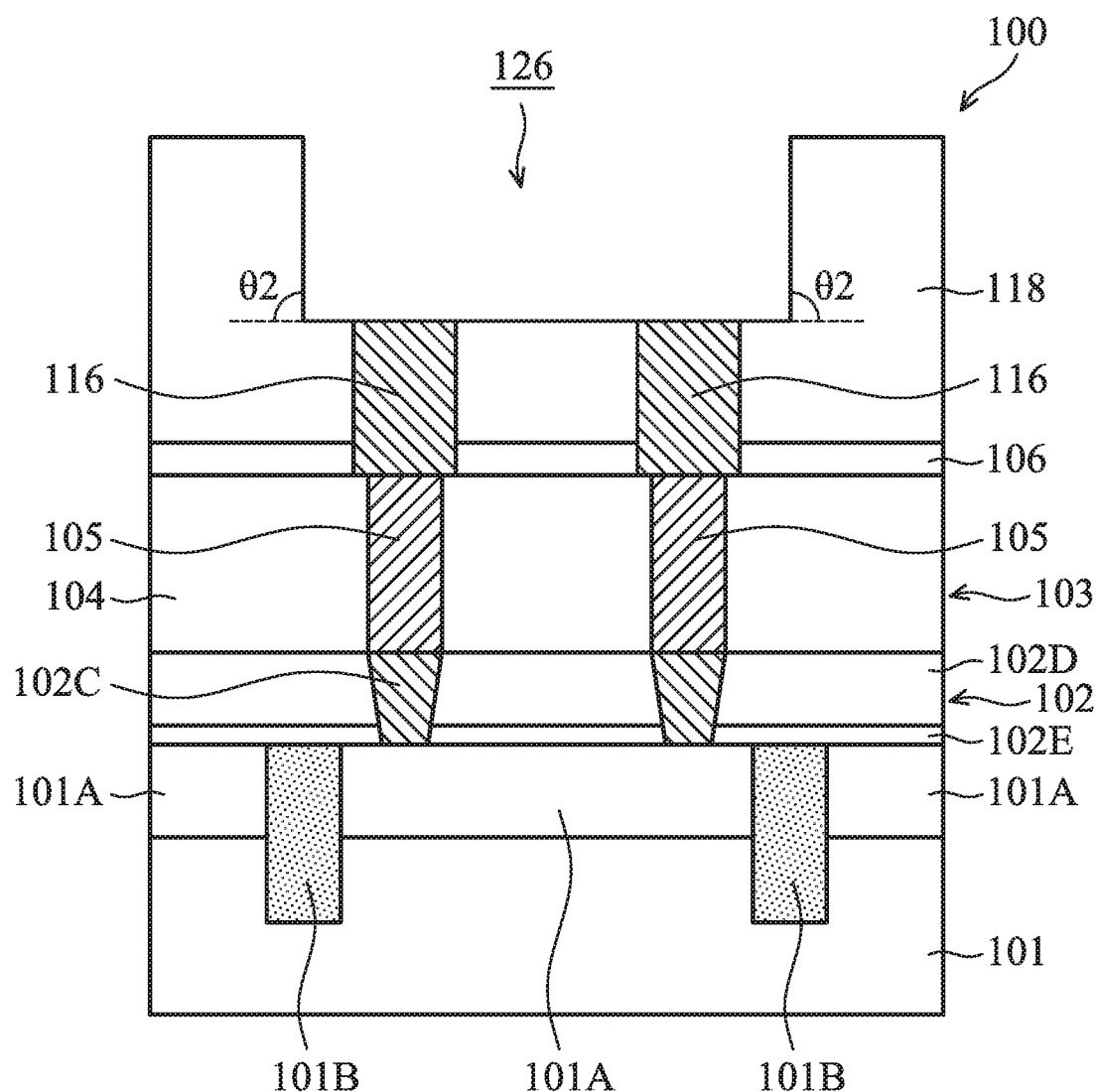
Figures 1, 1H, 2:
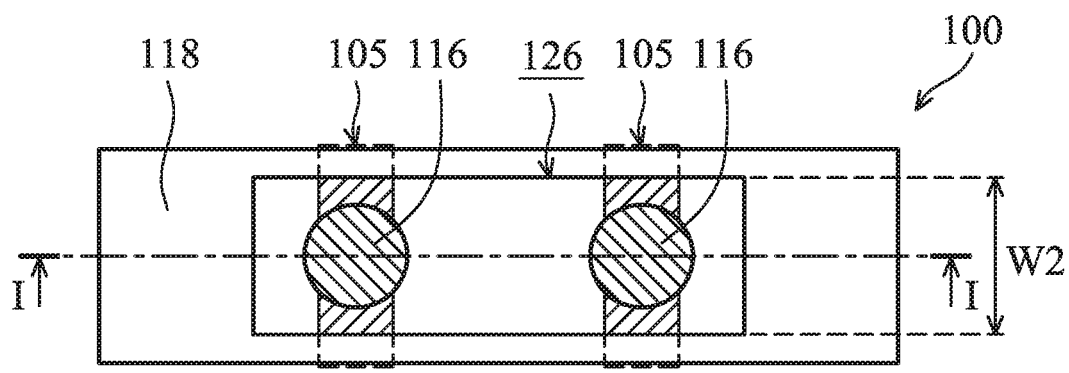
Figures 1, 1I:
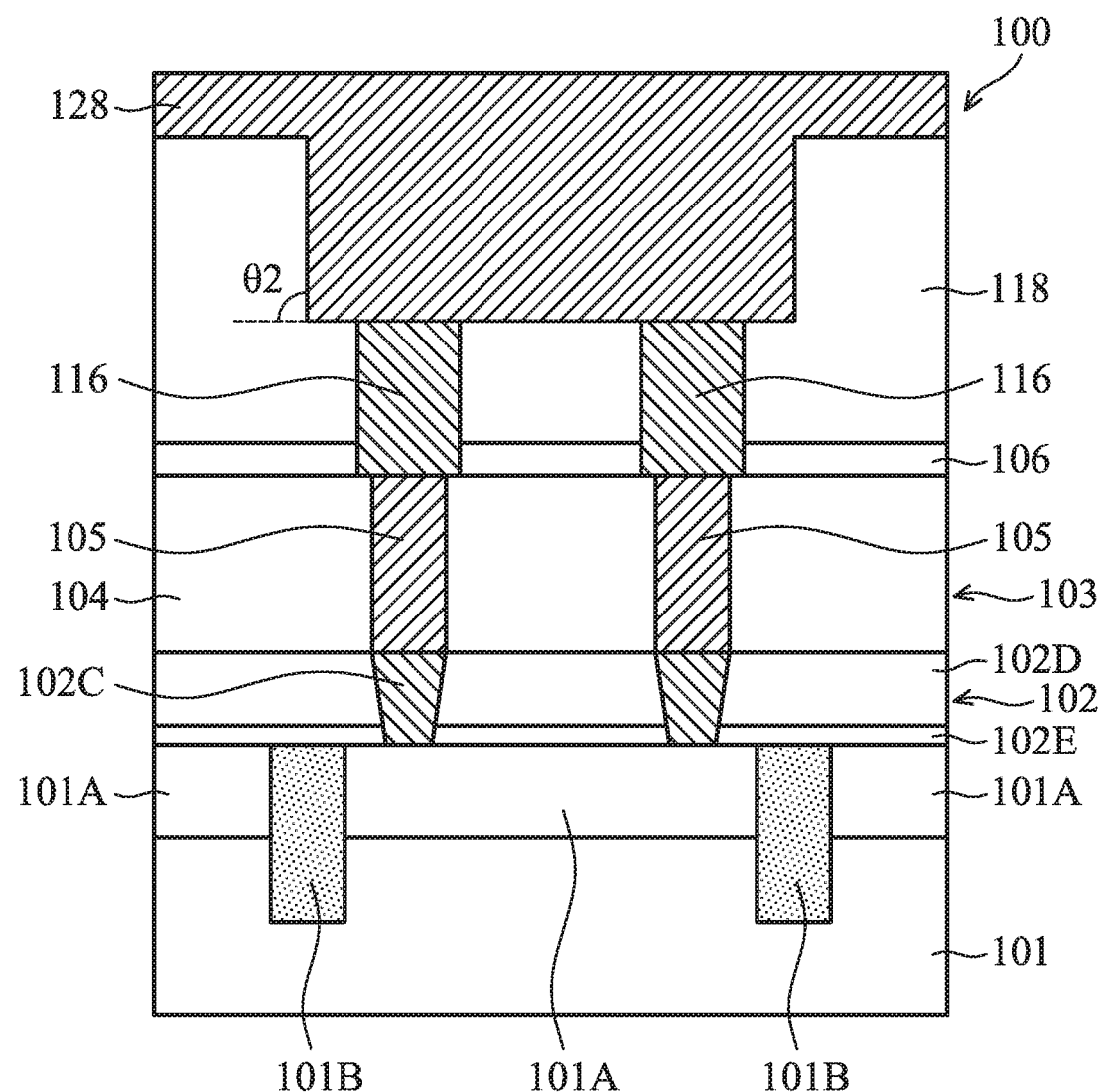
Figures 1, 1I, 2:
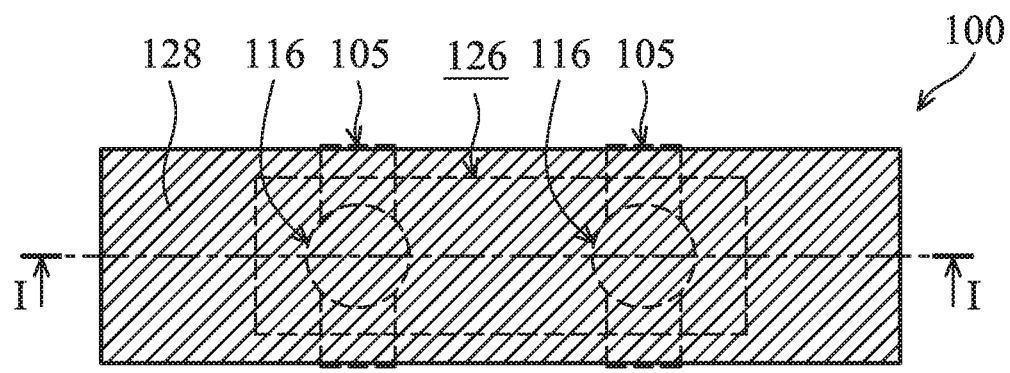
Figures 1, 1J:
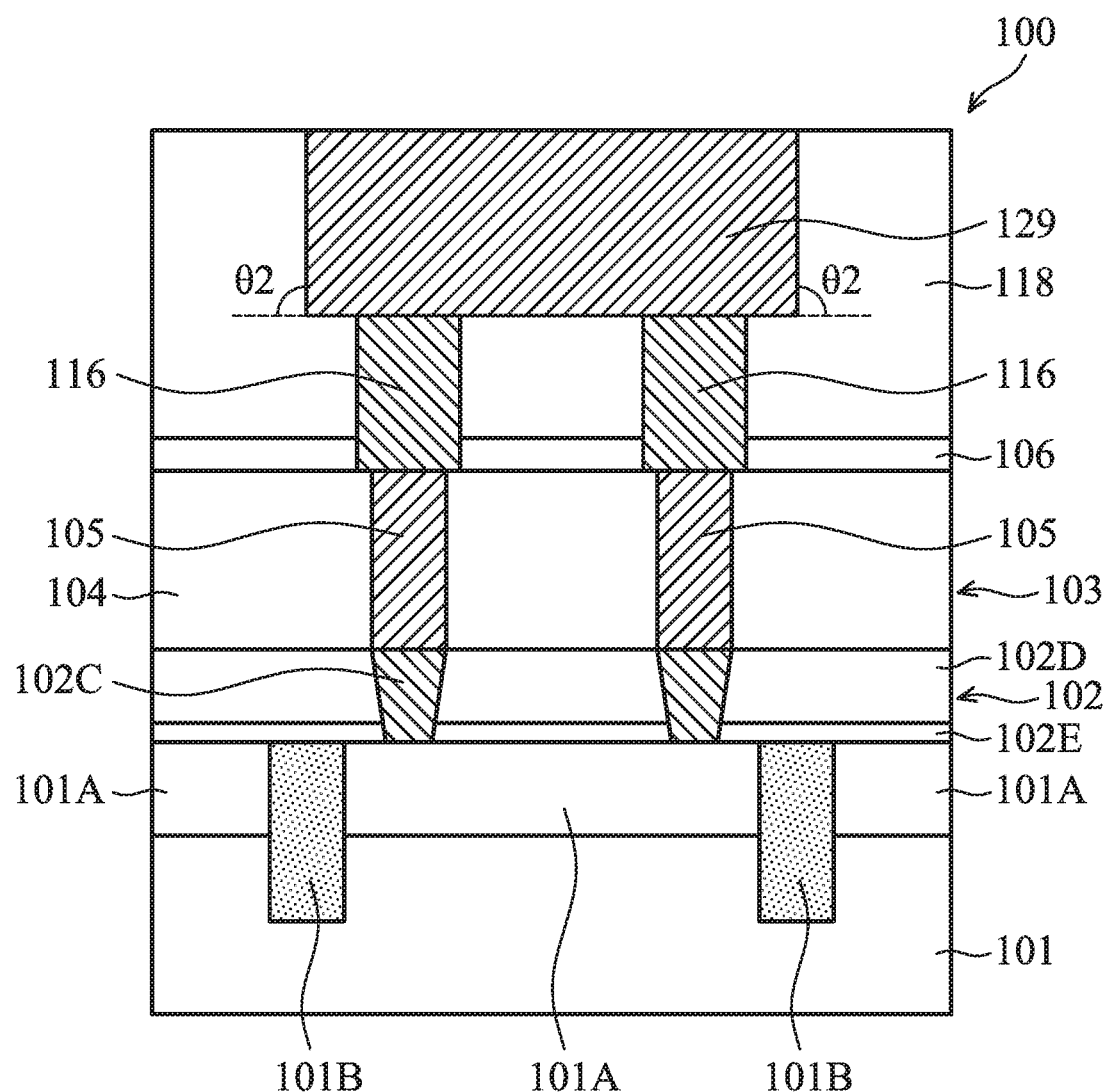
Figures 1, 1J, 2:
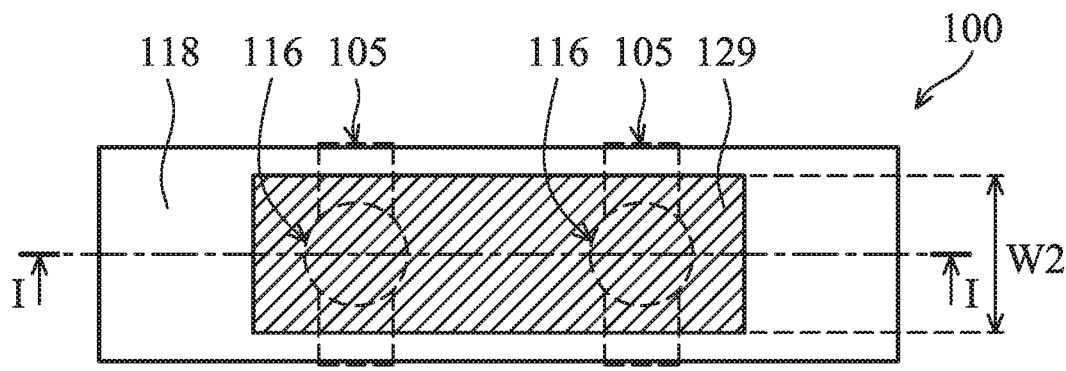

FIGS. 1A-1, 1B-1, 1C-1, 1D-1, 1E-1, 1F-1, 1G-1, 1H-1, 1I-1, 1J-1 and 1K show cross-sectional views of structures at various stages of an exemplary method for fabricating an interconnect structure for an integrated circuit device 100, in accordance with some embodiments. FIGS. 1A-2, 1B-2, 1C-2, 1D-2, 1E-2, 1F-2, 1G-2, 1H-2, 1I-2 and 1J-2 show top views of the structures of FIGS. 1A-1 to 1J-1 at various stages of the exemplary method for fabricating the interconnect structure for the integrated circuit device 100, in accordance with some embodiments. The cross-sectional views of the structures of FIGS. 1A-1 to 1J-1 are taken along line I-I of FIGS. 1A-2 to 1J-2, respectively.

The integrated circuit device 100 may be a portion of an IC chip or a system on chip (SoC). The integrated circuit device 100 may include a microprocessor, a memory, and/or other device. In some embodiments, the integrated circuit device 100 includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, another suitable component, or a combination thereof. The transistors may be planar transistors or other transistors, such as FinFETs. All figures of the embodiments have been simplified for the sake of clarity to better understand the inventive concepts of the present disclosure. Additional features can be added in the integrated circuit device 100, and some of the features described below can be replaced, modified, or eliminated in other embodiments of the integrated circuit device.

The integrated circuit device 100 includes a semiconductor substrate 101 that has Field Effect Transistors (FETs), for example planar FETs, FinFETs or another semiconductor device formed therein. Moreover, multiple passive components, for example, resistors, capacitors, and inductors may be formed over the semiconductor substrate 101. The semiconductor substrate 101 may be a bulk semiconductor substrate, a semiconductor-on-insulator (SOI) substrate, or another semiconductor substrate, which may be doped (e.g., with a p-type or an n-type dopant) or undoped. Generally, an SOI substrate includes a layer of a semiconductor material formed on an insulator layer. The insulator layer may be a buried oxide (BOX) layer, a silicon oxide layer, or the like. The insulator layer is provided on a silicon or glass substrate. The semiconductor substrate 101 may be made of silicon or another semiconductor material. For example, the semiconductor substrate 101 is a silicon wafer. In some examples, the semiconductor substrate 101 is made of a compound semiconductor such as silicon carbide, gallium arsenic, indium arsenide, or indium phosphide. In some examples, the semiconductor substrate 101 is made of an alloy semiconductor such as GaAsP, AlInAs, AlGaAs, GaInAs, GaInP, or GaInAsP.

The semiconductor substrate 101 includes multiple active regions 101A and each of the active regions 101A is surrounded by an isolation structure 101B in the semiconductor substrate 101, as shown in FIG. 1A-1 in accordance with some embodiments. The isolation structure 101B defines and electrically isolates the active region 101A from another active region 101A. The isolation structure 101B is for example a shallow trench isolation (STI) region, a deep trench isolation (DTI) region, or a local oxidation of silicon (LOCOS) region. The material of the isolation structure 101B includes silicon oxide, silicon nitride, silicon oxynitride, another suitable insulating material, or a combination thereof. The active region 101A may include various transistors as those described above, and not repeated again.

A contact etch stop layer (CESL) 102E is formed over the active regions 101A, the isolation structures 101B and the semiconductor substrate 101. An interlayer dielectric (ILD) layer 102D is formed on the CESL 102E. Multiple contacts 102C are formed in the ILD layer 102D and pass through the CESL 102E to electrically connect to the active region 101A. The CESL 102E, the ILD layer 102D and the contacts 102C may be referred to as a contact structure layer 102.

Generally, the CESL 102E can provide a mechanism to stop an etching process when forming contact holes of the contacts 102C. The CESL 102E can be formed of a dielectric material that has an etch selectivity different from adjacent layers, for example, the ILD layer 102D. The CESL 102E may be made of silicon nitride, silicon carbon nitride, silicon carbon oxide, or a combination thereof, and may be deposited by chemical vapor deposition (CVD), plasma enhanced CVD (PECVD), atomic layer deposition (ALD), or another deposition technique.

The ILD layer 102D may be made of silicon dioxide, silicon oxynitride, a low-k dielectric material (e.g., a material having a dielectric constant (k value) lower than k value (about 3.9) of silicon dioxide), such as phosphosilicate glass (PSG), borosilicate glass (BSG), borophosphosilicate glass (BPSG), undoped silicate glass (USG), fluorinated silicate glass (FSG), organosilicate glasses (OSG), SiOxCy, spin-on-glass (SOG), spin-on-polymers, silicon carbon material, or a combination thereof. The ILD layer 102D may be deposited by spin-on coating, CVD, flowable CVD (FCVD), PECVD, physical vapor deposition (PVD), or another deposition technique.

Next, contact holes are formed in the ILD layer 102D and passes through the CESL 102E using photolithography and etching processes. Afterwards, a conductive material of the contacts 102C is deposited on the ILD layer 102D and to fill the contact holes. The conductive material includes a metal, such as cobalt, tungsten, copper, aluminum, gold, silver, alloys thereof, or a combination thereof. The conductive material may be deposited by CVD, ALD, PVD, or another deposition technique. A planarization process, such as a CMP process, may be performed to remove excess portions of the conductive material from the top surface of the ILD layer 102D to form the contacts 102C.

Next, a conductive line layer 103 is formed on the contact structure layer 102, as shown in FIG. 1A-1 in accordance with some embodiments. The conductive line layer 103 includes multiple metal lines 105 embedded in a first dielectric layer 104. The first dielectric layer 104 is also referred to as an inter-metal dielectric (IMD) layer. The metal lines 105 are electrically connected to the contacts 102C of the contact structure layer 102, respectively. The material of the first dielectric layer 104 includes silicon carbide (SiC), silicon dioxide ($SiO_2$), silicon oxycarbide (SiOC), silicon nitride (SiN), silicon carbon nitride (SiCN), silicon oxynitride (SiON), silicon carbon oxynitride (SiOCN), a low-k dielectric material (e.g., a material has a k-value lower than about 3.9) or a combination thereof. The low-k dielectric material is for example PSG, BSG, BPSG, USG, FSG, OSG, SOG, carbon doped silicon oxide, Black Diamond® (Applied Materials of Santa Clara, Calif.), Xerogel, Aerogel, amorphous fluorinated carbon, parylene, benzocyclobutene (BCB), SiLK (Dow Chemical, Midland, Mich.) or polyimide. The first dielectric layer 104 may be deposited at a temperature from about 30° C. to about 400° C. by spin-on coating, CVD, FCVD, PECVD, PVD, or another deposition technique. In some examples, the first dielectric layer 104 has a thickness that is in a range from about 30 Å to about 800 Å.

In some embodiments, the material of the metal lines 105 includes Ta, TaN, TiN, Cu, Co, Ru, Mo, Ir, or W. The metal lines 105 may be formed using photolithography, etching and deposition processes. The deposition process is for example, PVD, CVD, ALD or spin-on coating process and may be performed at a temperature from about 150° C. to about 400° C. In some examples, the metal lines 105 have a thickness that is in a range from about 10 Å to about 1000 Å.

Next, an etch stop layer 106 is deposited on the conductive line layer 103, as shown in FIG. 1A-1 in accordance with some embodiments. The material of the etch stop layer 106 is different from the material of the first dielectric layer 104. The material of the etch stop layer 106 includes silicon nitride, silicon oxynitride, silicon carbon nitride, silicon carbon oxide, or a combination thereof, and may be deposited by CVD, PECVD, ALD, or another deposition technique. In some examples, the etch stop layer 106 has a thickness that is in a range from about 1A to about 200 Å. FIG. 1A-2 shows a top view of the structure of FIG. 1A-1 in accordance with some embodiments. The cross-sectional view of FIG. 1A-1 is taken along line I-I of FIG. 1A-2. The metal lines 105 are disposed under the etch stop layer 106 and are parallel with each other. In some embodiments, the metal lines 105 are extended in a first direction, for example a Y-axial direction.

Afterwards, a disposable material layer such as a bottom anti-reflective coating (BARC) layer 108 is formed on the etch stop layer 106, as shown in FIG. 1B-1 in accordance with some embodiments. The material of the disposable material layer or the BARC layer 108 may be an organic or inorganic insulating material and may be coated by spin-on coating process or deposited by CVD, PECVD or another deposition technique. In some embodiments, the disposable material layer or the BARC layer 108 has a thickness that is in a range from about 80 Å to about 1200 Å.

Next, a patterned mask such as a patterned photoresist layer 110 is formed on the BARC layer 108, as shown in FIG. 1B-1 in accordance with some embodiments. The patterned photoresist layer 110 is formed using a photolithography process and has multiple openings 112 to expose portions of the BARC layer 108. FIG. 1B-2 shows a top view of the structure of FIG. 1B-1 in accordance with some embodiments. The cross-sectional view of FIG. 1B-1 is taken along line I-I of FIG. 1B-2. The openings 112 of the patterned photoresist layer 110 are aligned with the metal lines 105, as shown in FIG. 1B-2 in accordance with some embodiments. The shape of the openings 112 may be a circle, an ellipse, a square, a rectangle, a polygon or another shape, and may be wider than the metal lines 105.

Afterwards, the patterned photoresist layer 110 is used as an etch mask in an etching process to form multiple openings 114 in the BARC layer 108, as shown in FIG. 1C-1 in accordance with some embodiments. The etching process is anisotropic and is selective to the material of the BARC layer 108. The etching process is a dry etching process such as reactive ion etch (RIE), neutral beam etch (NBE), or a combination thereof. The dry etching process may be performed with fluorine-based plasma and may use etch gases selected from the group consisting of $C_4F_8$, $C_4F_6$, $CF_4$, $CHF_3$, $CH_2F_2$, $CH_3F$, Ar, He, $Cl_2$, $N_2$, $H_2$, $O_2$ and HBr. The BARC layer 108 has an etching selectivity to the etch stop layer 106 in the etching process. In some examples, the etch selectivity is in a range from greater than about 10 to about 100. After the openings 114 are formed to pass through the BARC layer 108, the etching process stops on the etch stop layer 106. Subsequently, the patterned photoresist layer 110 is removed using, for example, an ashing process or a wet strip process.

FIG. 1C-2 shows a top view of the structure of FIG. 1C-1 in accordance with some embodiments. The cross-sectional view of FIG. 1C-1 is taken along line I-I of FIG. 1C-2. The openings 114 of the BARC layer 108 are aligned with the metal lines 105 and expose portions of the etch stop layer 106, as shown in FIG. 1C-2 in accordance with some embodiments. The shape of the openings 114 may be a circle, an ellipse, a square, a rectangle, a polygon or another shape, and may be wider than the metal lines 105 in some embodiments. The shape and the size of the openings 114 may be the same as those of the openings 112 of the patterned photoresist layer 110.

Next, the portions of the etch stop layer 106 exposed through the openings 114 of the BARC layer 108 are removed to expose portions of the metal lines 105, as shown in FIG. 1D-1 in accordance with some embodiments. The openings 114 of the BARC layer 108 are extended to the top surfaces of the metal lines 105 to form openings 114'. There is an angle θ1 between the sidewall of the opening 114' and the top surface of the first dielectric layer 104, as shown in FIG. 1D-1 in accordance with some embodiments. In some examples, the angle θ1 is in a range from about 40 degrees to about 90 degrees. While the angle θ1 is smaller than 90 degrees, the top width W1 of the opening 114' is larger than the bottom width of the opening 114'. The top width W1 of the opening 114' is in a range from about 5 nm to about 300 nm.

The portions of the etch stop layer 106 are removed by a dry etching process or a wet clean process. In some embodiments, the dry etching process may be reactive ion etch (RIE) using inductively coupled plasma (ICP), capacitively coupled plasma (CCP) or remote plasma. The etch gases used in the dry etching process are selected from the group consisting of $CH_4$, $CH_3F$, $CH_2F_2$, $CHF_3$, $C_4Fg$, $C_4F_6$, $CF_4$, $H_2$, HBr, CO, $CO_2$, $O_2$, $BCl_3$, $Cl_2$, $N_2$, He, Ne, Ar and another suitable etch gas. In some instances, the dry etching process is performed using a pressure of about 0.2 mTorr to about 120 mTorr, a temperature of about 0° C. to about 100° C., a power of about 50 W to about 3000 W, and a bias of about 0V to about 1200V. In some examples, the wet clean process uses an etch solution, for example diluted hydrofluoric acid (dHF), nitric acid ($HNO_3$), phosphoric acid ($H_3PO_4$) or a combination thereof.

FIG. 1D-2 shows a top view of the structure of FIG. 1D-1 in accordance with some embodiments. The cross-sectional view of FIG. 1D-1 is taken along line I-I of FIG. 1D-2. The openings 114' of the BARC layer 108 and the etch stop layer 106 are aligned with the metal lines 105 and expose portions of the metal lines 105 and the first dielectric layer 104, as shown in FIG. 1D-2 in accordance with some embodiments. The shape of the openings 114' may be a circle, an ellipse, a square, a rectangle, a polygon or another shape, and may be wider than the metal lines 105 to expose portions of the first dielectric layer 104. The shape and the size of the openings 114' are the same as those of the openings 114 of the BARC layer 108.

Next, conductive pillars 116 are formed in the openings 114' (FIG. 1D-1) of the BARC layer 108 and the etch stop layer 106 to be in contact with the metal lines 105, respectively, as shown in FIG. 1E-1 in accordance with some embodiments. The material of the conductive pillars 116 includes Ta, TaN, TiN, Cu, Co, Ru, Mo, Ir, W or a combination thereof. The conductive pillars 116 are selectively deposited in the openings 114' using PVD, CVD, ALD or a spin-on coating process at a temperature from about 30° C. to about 400° C. In some embodiments, the conductive pillars 116 deposited in the openings 114' have a top surface that is lower than the top surface of the BARC layer 108.

In some embodiments, the material for the conductive pillars 116 is deposited on the BARC layer 108 and to fill the openings 114'. The excess portion of the material for the conductive pillars 116 deposited on the BARC layer 108 can be removed by a planarization process, for example a chemical mechanical polishing (CMP) process. Next, an etch back process is performed to remove an top portion of the deposited material for the conductive pillars 116 in the openings 114', such that the conductive pillars 116 have a top surface that is lower than the top surface of the BARC layer 108.

In some examples, the conductive pillars 116 have a height that is in a range from about 10 Å to about 1000 Å. The top surface of the conductive pillars 116 being lower than the top surface of the BARC layer 108 can prevent the adjacent conductive pillars 116 from coming into contact with each other, and thereby avoiding a short circuit. There is an angle θ1 between the sidewall of the conductive pillar 116 and the top surface of the first dielectric layer 104, as shown in FIG. 1E-1 in accordance with some embodiments. In some examples, the angle θ1 is in a range from about 40 degrees to about 90 degrees. While the angle θ1 is smaller than 90 degrees, the top width W1 of the conductive pillar 116 is larger than the bottom width of the conductive pillar 116. The conductive pillar 116 may have an inverted trapezoid cross-section. In some instances, the top width W1 of the conductive pillar 116 is in a range from about 5 nm to about 300 nm.

FIG. 1E-2 shows a top view of the structure of FIG. 1E-1 in accordance with some embodiments. The cross-sectional view of FIG. 1E-1 is taken along line I-I of FIG. 1E-2. The conductive pillars 116 are formed on and aligned with the metal lines 105, respectively, as shown in FIG. 1D-2 in accordance with some embodiments. Although FIG. 1E-2 shows one conductive pillar 116 on one metal line 105, there may be multiple separated conductive pillars 116 disposed on the same metal line 105. The shape of the top surface of the conductive pillar 116 may be a circle, an ellipse, a square, a rectangle, a polygon or another shape, and may be wider than the metal lines 105 to be in contact with portions of the first dielectric layer 104.

Afterwards, the BARC layer 108 is removed, and a second dielectric layer 118 is deposited on the etch stop layer 106 to cover the conductive pillars 116, as shown in FIG. 1F-1 in accordance with some embodiments. The BARC layer 108 is removed by a wet etching process or a dry etching process. The wet etching process is performed with etchant solution, for example acid solution of HCl, $NH_4OH$ or $H_2SO_4$ mixed with $H_2O_2$, or another suitable etchant solution. The dry etching process is performed with etch gases selected from the group consisting of $CH_4$, $CH_3F$, $CH_2F_2$, $CHF_3$, $C_4F_8$, $C_4F_6$, $CF_4$, $NF_3$, $H_2$, HBr, CO, $CO_2$, $O_2$, $BCl_3$, $Cl_2$, $SiCl_4$, $N_2$, He, Ne and Ar, or another suitable etch gas.

The material of the second dielectric layer 118 includes silicon carbide (SiC), silicon dioxide ($SiO_2$), silicon oxycarbide (SiOC), silicon nitride (SiN), silicon carbon nitride (SiCN), silicon oxynitride (SiON), silicon carbon oxynitride (SiOCN), a low-k dielectric material (e.g., a material has a k-value lower than about 3.9), for example PSG, BSG, BPSG, USG, FSG, OSG, SOG, spin-on-polymers or a combination thereof. In some embodiments, the material of the second dielectric layer 118 is the same as the material of first dielectric layer 104 and different from the material of the etch stop layer 106. In some embodiments, the material of the second dielectric layer 118 is different from the material of the first dielectric layer 104 and is also different from the material of the etch stop layer 106. The second dielectric layer 118 may be deposited at a temperature from about 30° C. to about 400° C. by spin-on coating, CVD, FCVD, PECVD, PVD, or another deposition technique. In some examples, the second dielectric layer 118 has a thickness that is in a range from about 30 Å to about 800 Å.

FIG. 1F-2 shows a top view of the structure of FIG. 1F-1 in accordance with some embodiments. The cross-sectional view of FIG. 1F-1 is taken along line I-I of FIG. 1F-2. The second dielectric layer 118 covers the conductive pillars 116, the etch stop layer 106 and other underlying features such as the metal lines 105 and the first dielectric layer 104, as shown in FIG. 1F-2 in accordance with some embodiments.

Next, another BARC layer 120 is coated on the second dielectric layer 118, and another patterned photoresist layer 122 is formed on the BARC layer 120, as shown in FIG. 1G-1 in accordance with some embodiments. The patterned photoresist layer 122 is formed using photolithography process to have an opening 124 to expose a portion of the BARC layer 120. FIG. 1G-2 shows a top view of the structure of FIG. 1G-1 in accordance with some embodiments. The cross-sectional view of FIG. 1G-1 is taken along line I-I of FIG. 1G-2. The shape of the opening 124 may be a rectangle that has a longitudinal direction perpendicular to the longitudinal direction of the metal lines 105, as shown in FIG. 1G-2 in accordance with some embodiments. The opening 124 of the patterned photoresist layer 122 is situated across the metal lines 105 and the conductive pillars 116. The material of the BARC layer 120 may be the same as or similar to the material of the BARC layer 108.

Afterwards, the BARC layer 120 and the second dielectric layer 118 are etched using the patterned photoresist layer 122 as an etch mask in an etching process to form a trench 126 in the second dielectric layer 118, as shown in FIG. 1H-1 in accordance with some embodiments. The etching process is anisotropic and is selective to the materials of the BARC layer 120 and the second dielectric layer 118. The etching process is a dry etching process for example reactive ion etch (RIE) using inductively coupled plasma (ICP) or capacitively coupled plasma (CCP). The etch gases used in the dry etching process are selected from the group consisting of $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, Ar and another suitable etch gas. The dry etching process may be performed with a pressure of about 0.2 mTorr to about 120 mTorr, a temperature of about 0° C. to about 100° C., a power of about 50 W to about 3000 W, and a bias of about 0V to about 1200V. After the trench 126 is formed in the second dielectric layer 118 to expose the top surfaces of the conductive pillars 116, the etching process is stopped on the conductive pillars 116. Subsequently, the remaining portions of the patterned photoresist layer 122 and the BARC layer 120 are removed in an ashing process or a wet etching process, for example.

There is an angle θ2 between the sidewall of the trench 126 and the extending horizontal plane of the bottom surface of the trench 126 at the side of the second dielectric layer 118, as shown in FIG. 1H-1 in accordance with some embodiments. In some examples, the angle θ2 is in a range from about 50 degrees to about 90 degrees. FIG. 1H-2 shows a top view of the structure of FIG. 1H-1 in accordance with some embodiments. The cross-sectional view of FIG. 1H-1 is taken along line I-I of FIG. 1H-2. The conductive pillars 116 and portions of the metal lines 105 are exposed through the trench 126, as shown in FIG. 1H-2 in accordance with some embodiments. The shape of the trench 126 may be a rectangle that has a longitudinal direction perpendicular to the longitudinal direction of the metal lines 105. In some examples, the trench 126 has a top width W2 that is in a range from about 10 nm to about 300 nm. While the angle θ2 is smaller than 90 degrees, the top width W2 of the trench 126 is larger than the bottom width of the trench 126.

Next, a conductive material 128 is deposited on the second dielectric layer 118 and to fill the trench 126, as shown in FIG. 1I-1 in accordance with some embodiments. The portion of the conductive material 128 in the trench 126 is in contact with the conductive pillars 116. The conductive material 128 includes Ta, TaN, TiN, Cu, Co, Ru, Mo, Ir, W or a combination thereof. The conductive material 128 may be deposited using PVD, CVD, ALD or a spin-on coating process at a temperature from about 150° C. to about 400° C. FIG. 1I-2 shows a top view of the structure of FIG. 1I-1 in accordance with some embodiments. The cross-sectional view of FIG. 1I-1 is taken along line I-I of FIG. 1I-2. The conductive material 128 covers the second dielectric layer 118, the conductive pillars 116 and the metal lines 105, as shown in FIG. 1I-2 in accordance with some embodiments.

Next, the excess portion of the conductive material 128 on the second dielectric layer 118 is removed by a planarization process, for example a CMP process, to form a conductive line 129, as shown in FIG. 1J-1 in accordance with some embodiments. The conductive line 129 has a top surface that is coplanar with the top surface of the second dielectric layer 118. The bottom of the conductive line 129 is connected to and in contact with the top surfaces of the conductive pillars 116. In addition, the conductive line 129 and the conductive pillars 116 are embedded in the second dielectric layer 118. The combined profile of the conductive line 129 and the conductive pillars 116 is similar to the profile of an interconnect structure formed by a dual damascene process. In some examples, the thickness of the conductive line 129 is in a range from about 10 Å to about 1000 Å. There is an angle θ2 between the sidewall of the conductive line 129 and the extending horizontal plane of the bottom surface of the conductive line 129 at the side of the second dielectric layer 118, as shown in FIG. 1J-1 in accordance with some embodiments. In some examples, the angle θ2 is in a range from about 50 degrees to about 90 degrees.

FIG. 1J-2 shows a top view of the structure of FIG. 1J-1 in accordance with some embodiments. The cross-sectional view of FIG. 1J-1 is taken along line I-I of FIG. 1J-2. The conductive line 129 is electrically coupled to the metal lines 105 through the conductive pillars 116, as shown in FIGS. 1J-1 and 1J-2 in accordance with some embodiments. The conductive line 129 has a longitudinal direction perpendicular to the longitudinal direction of the metal lines 105. In some examples, the conductive line 129 has a top width W2 that is in a range from about 10 nm to about 300 nm. While the angle θ2 is smaller than 90 degrees, the top width W2 of the conductive line 129 is larger than the bottom width of the conductive line 129. The conductive line 129 may have an inverted trapezoid cross-section. The conductive line 129 and the conductive pillars 116 embedded in the second dielectric layer 118 may be referred to as an interconnect layer of the interconnect structure for the integrated circuit device 100.

Figure 1K:
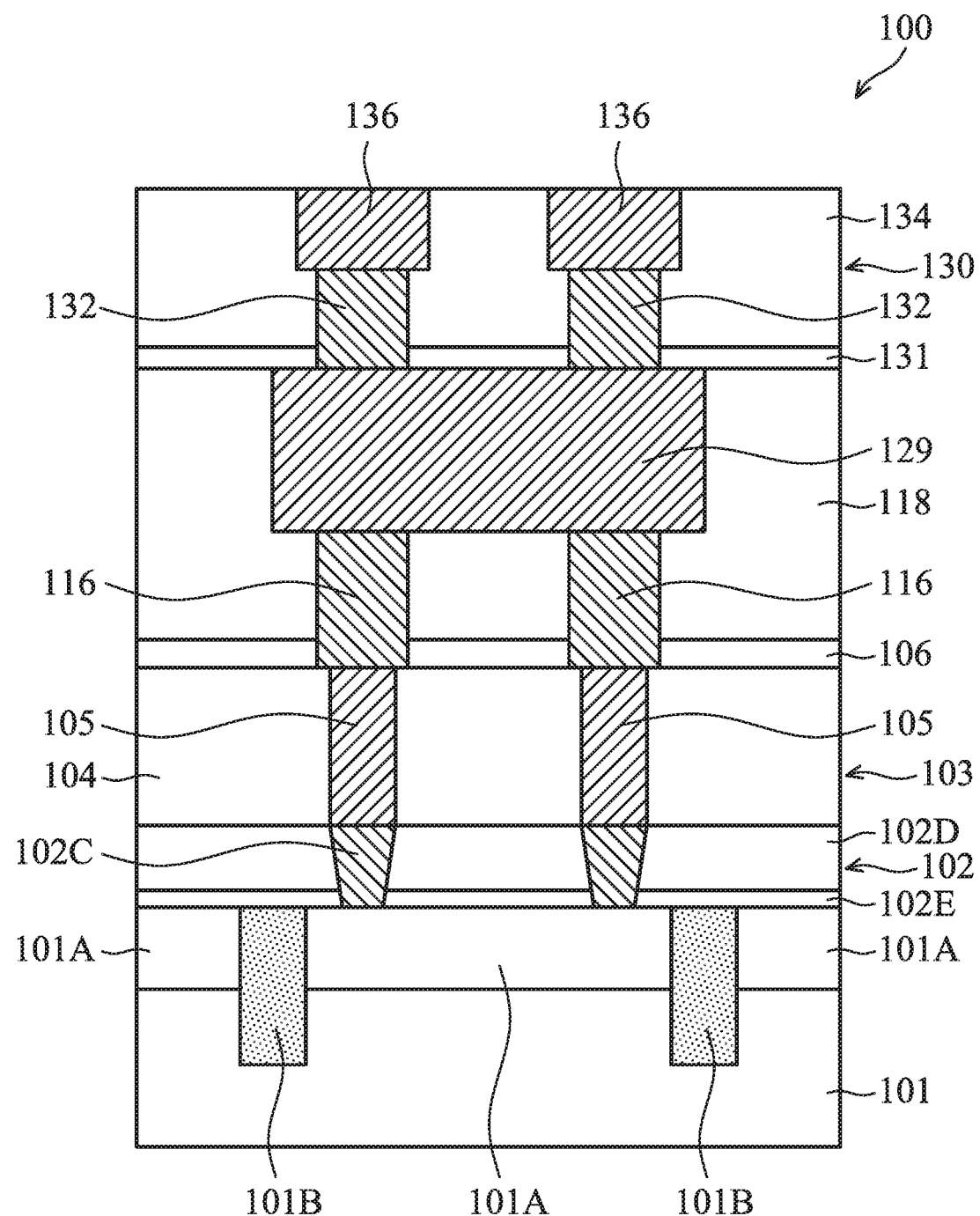
Figure 2:
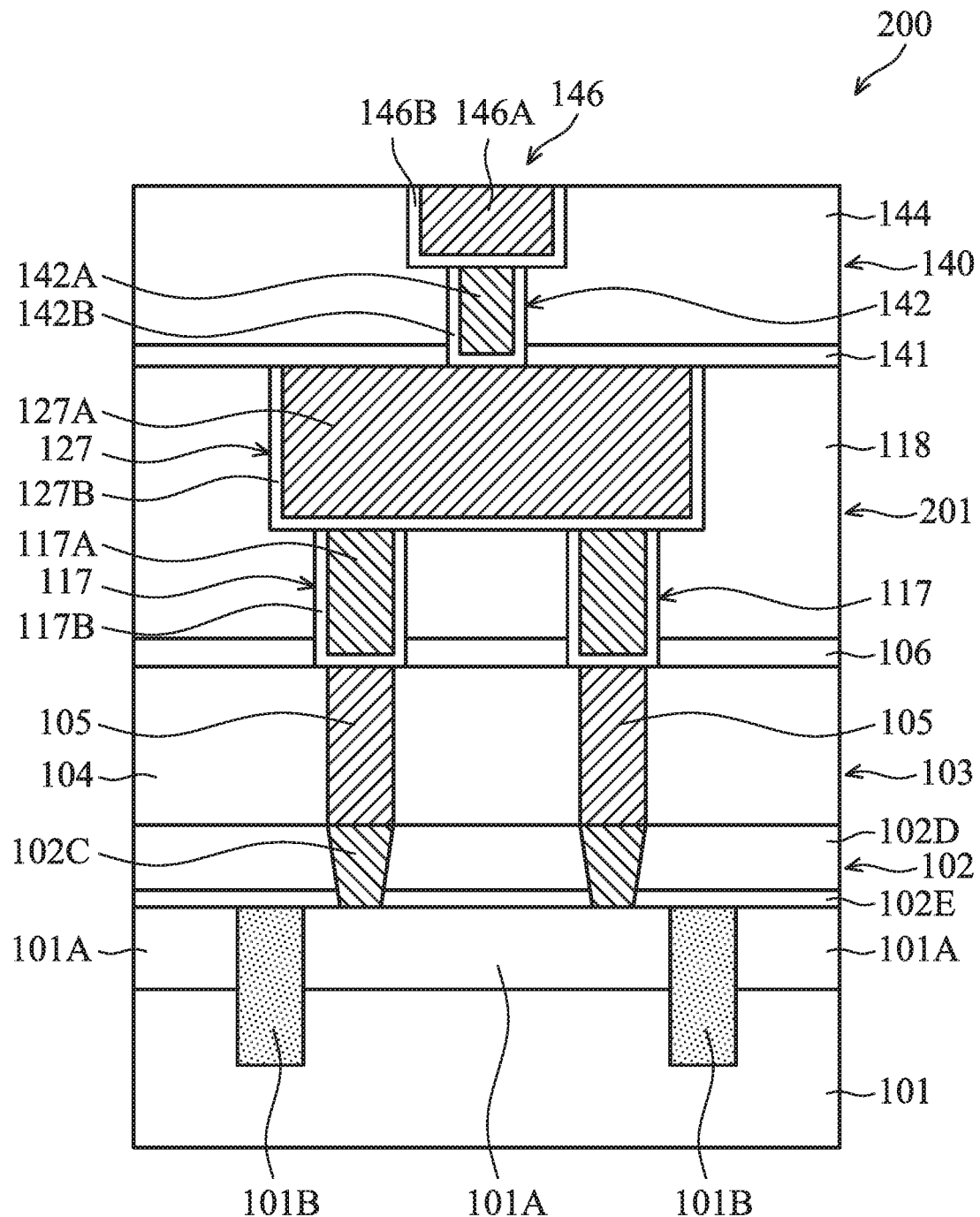

Furthermore, an upper interconnect layer 130 is formed on the conductive line 129, as shown in FIG. 1K in accordance with some embodiments. The upper interconnect layer 130 includes an etch stop layer 131 that is deposited on the conductive line 129 and the second dielectric layer 118. The material and process of forming the etch stop layer 131 may be the same as or similar to those described above with respect to the etch stop layer 106 of FIG. 1A-1. In some embodiments, the upper interconnect layer 130 also includes multiple conductive pillars 132 that are selectively deposited on the conductive line 129 and pass through the etch stop layer 131 to be in contact with the conductive line 129. The material and process of forming the conductive pillars 132 may be the same as or similar to those described above with respect to the conductive pillars 116 of FIG. 1B-1 to FIG. 1E-1.

The upper interconnect layer 130 may further include multiple conductive lines 136 that are formed on and in contact with the conductive pillars 132, respectively. The conductive lines 136 have a longitudinal direction that is perpendicular to the longitudinal direction of the conductive line 129. The material and process of forming the conductive lines 136 may be the same as or similar to those described above with respect to the conductive line 129 of FIG. 1F-1 to FIG. 1J-1.

In addition, the upper interconnect layer 130 includes a third dielectric layer 134 deposited on the etch stop layer 131. The conductive pillars 132 and the conductive lines 136 are embedded in the third dielectric layer 134. The material and process of forming the third dielectric layer 134 may be the same as or similar to those described above with respect to the second dielectric layer 118 of FIG. 1F-1. Although the integrated circuit device 100 of FIG. 1K shows one upper interconnect layer 130, there may be one or more upper interconnect layer 130, one or more interconnect layer with structure formed by a dual damascene process, or a combination thereof stacked with an interconnect layer having the selectively deposited conductive pillars of the embodiments of the disclosure.

FIG. 2 shows a cross-sectional view of an integrated circuit device 200 with selectively deposited pillars in an interconnect structure, in accordance with some embodiments. The integrated circuit device 200 includes a lower interconnect layer 201 formed on the conductive line layer 103. The conductive line layer 103 includes multiple metal lines 105 in the first dielectric layer 104. The material and process of forming the conductive line layer 103 and the underlying structures are described above with respect to FIG. 1A-1. The lower interconnect layer 201 includes multiple conductive pillars 117 that are formed on the metal lines 105, respectively, and pass through the etch stop layer 106 to be in contact with the metal lines 105. In some embodiments, the conductive pillar 117 includes a liner 117B and a conductive material 117A surrounded by the liner 117B.

The liner 117B may be used as a diffusion barrier layer, an adhesion layer, or a combination thereof. The material of the liner 117B is for example titanium, titanium nitride, tantalum, tantalum nitride, or a combination thereof, and may be deposited by ALD, PECVD, PVD, or another deposition technique. In some examples, the liner 117B has a thickness that is in a range from about 5 Å to about 25 Å. The conductive material 117A includes Ta, TaN, TiN, Cu, Co, Ru, Mo, Ir, or W. The conductive material 117A may be deposited using PVD, CVD, ALD or a spin-on coating process at a temperature from about 30° C. to about 400° C.

In accordance with some embodiments, the liner 117B is conformally deposited on the BARC layer 108 and in the opening 114' of the BARC layer 108 and the etch stop layer 106 (FIG. 1D-1). Next, the conductive material 117A is deposited on the liner 117B over the BARC layer 108 and to fill the opening 114'. Afterwards, a planarization process such as a CMP process is performed to remove excess portions of the conductive material 117A and the liner 117B deposited on the BARC layer 108 to form the conductive pillars 117. Thereafter, the top surfaces of the conductive pillars 117 are coplanar with the top surface of the BARC layer 108. In some embodiments, after the planarization process, the materials of the conductive material 117A and the liner 117B in the opening 114' are etched back to form the conductive pillars 117. Thereafter, the top surfaces of the conductive pillars 117 are lower than the top surface of the BARC layer 108. Afterwards, the BARC layer 108 is removed by a dry etching process or a wet etching process.

The lower interconnect layer 201 further includes a conductive line 127 formed on and in contact with the conductive pillars 117. The conductive line 127 includes a liner 127B and a conductive material 127A surrounded by the liner 127B. The liner 127B may be used as a diffusion barrier layer, an adhesion layer, or a combination thereof. The material and process of forming the liner 127B may be the same as or similar to those of forming the liner 117B. The conductive material 127A includes Ta, TaN, TiN, Cu, Co, Ru, Mo, Ir, or W. The conductive material 127A may be deposited using PVD, CVD, ALD or a spin-on coating process at a temperature from about 150° C. to about 400° C.

In some embodiments, the liner 127B is conformally deposited on the second dielectric layer 118 and in the trench 126 of the second dielectric layer 118 (FIG. 1H-1). Next, the conductive material 127A is deposited on the liner 127B over the second dielectric layer 118 and to fill the trench 126. Afterwards, a planarization process such as a CMP process is performed to remove excess portions of the conductive material 127A and the liner 127B deposited on the second dielectric layer 118 to form the conductive line 127. Thereafter, the top surface of the conductive line 127 is coplanar with the top surface of the second dielectric layer 118.

In addition, an upper interconnect layer 140 is formed on the conductive line 127, as shown in FIG. 2 in accordance with some embodiments. The upper interconnect layer 140 includes an etch stop layer 141 that is deposited on the conductive line 127 and the second dielectric layer 118. The material and process of forming the etch stop layer 141 may be the same as or similar to those described above with respect to the etch stop layer 106 of FIG. 1A-1. The upper interconnect layer 140 also includes a conductive pillar 142 that is selectively deposited on the conductive line 127 and pass through the etch stop layer 141 to be in contact with the conductive line 127. The conductive pillar 142 includes a liner 142B and a conductive material 142A surrounded by the liner 142B. The material and process of forming the conductive pillar 142 may be the same as or similar to those described above with respect to the conductive pillars 117.

The upper interconnect layer 140 further includes a conductive line 146 that is formed on and in contact with the conductive pillar 142. The material and process of forming the conductive line 146 may be the same as or similar to those described above with respect to the conductive line 127. The conductive line 146 has a longitudinal direction that is perpendicular to the longitudinal direction of the conductive line 127. In addition, the upper interconnect layer 140 includes a third dielectric layer 144 deposited on the etch stop layer 141. The conductive pillar 142 and the conductive line 146 are embedded in the third dielectric layer 144. The material and process of forming the third dielectric layer 144 may be the same as or similar to those described above with respect to the second dielectric layer 118 of FIG. 1F-1.

Although the integrated circuit device 200 of FIG. 2 shows one upper interconnect layer 140, there may be one or more upper interconnect layer 140, one or more upper interconnect layer 130 of FIG. 1K, one or more interconnect layer with structure formed by a dual damascene process, or a combination thereof stacked with an interconnect layer having the selectively deposited conductive pillars of the embodiments of the disclosure.

In the embodiments of the disclosure, the conductive pillars are formed firstly and selectively deposited in the openings of the BARC layer (or the disposable material layer). Therefore, the positions of the conductive pillars can be controlled precisely without overlay shift. In addition, the portions of the etch stop layer directly on the metal lines are removed through the openings of the BARC layer by a dry etching process or a wet clean process. The first dielectric layer around the metal lines is protected by the BARC layer without damage during the etching process for removing the etch stop layer. Therefore, the critical dimension (CD) of the conductive pillars can be controlled precisely to prevent from a large size than a predetermined value.

Moreover, the conductive line of the embodiments of the disclosure is formed by filling the trench of the second dielectric layer with a conductive material after the conductive pillars are formed. In some instances, the trench has an aspect ratio of about 0.5 to about 5. Therefore, the filling process of forming the conductive line of the embodiments of the disclosure is easier than the dual damascene process that needs to fill via holes firstly and then to fill a trench.

In addition, according to the embodiments of the disclosure, the trench for forming the conductive line is formed after the conductive pillars are formed in the second dielectric layer. There is no need to form via holes under the trench using an etching process. The etching depth loading control is thereby improved. Therefore, the portions of the second dielectric layer around the conductive pillars and under the trench are not damaged in the embodiments of the disclosure. Moreover, the top rounding in the dielectric layer around via that occurs during the dual damascene process can be avoided. As a result, there is a right angle between the bottom surface of the conductive line and the sidewall of the conductive pillar in the embodiments of the disclosure.

According to the benefits mentioned above, the embodiments of the disclosure are suitable for integrated circuit devices at technology nodes of sub-20 nm, such as 16 nm (N16) to 3 nm (N3) and beyond.

According to some embodiments of the disclosure, firstly, the selectively deposited conductive pillars 116 are formed in the openings 114' of the BARC layer (or the disposable material layer) 108 and the etch stop layer 106 to be in contact with the metal lines 105. Next, the BARC layer 108 is removed and the second dielectric layer 118 is deposited on the etch stop layer 106 to cover the conductive pillars 116. Afterwards, the second dielectric layer 118 is etched to form the trench 126 above the conductive pillars 116. The trench 126 is filled with the conductive material 128 to form the conductive line 129 that is in contact with the conductive pillars 116. The conductive line 129 and the conductive pillars 116 are embedded in the second dielectric layer 118 to form an interconnect layer of the interconnect structure for the integrated circuit device 100.

In some embodiments, a method of forming an interconnect structure for an integrated circuit device is provided. The method includes forming a conductive line layer over a semiconductor substrate. The conductive line layer includes a metal line. The method also includes forming a conductive pillar on and in contact with the metal line. The method further includes depositing a dielectric layer over the conductive line layer to cover the conductive pillar. In addition, the method includes etching the dielectric layer to form a trench. The conductive pillar is exposed through the trench. The method also includes filling the trench with a first conductive material to form a conductive line.

In some embodiments, a method of forming an interconnect structure for an integrated circuit device is provided. The method includes forming a conductive line layer over a semiconductor substrate. The conductive line layer includes a metal line embedded in a first dielectric layer. The method also includes coating a first bottom anti-reflective coating (BARC) layer over the conductive line layer, and etching the first BARC layer to form an opening. The method further includes forming a conductive pillar in the opening and electrically connected to the metal line. In addition, the method includes removing the first BARC layer, and depositing a second dielectric layer over the conductive line layer to cover the conductive pillar. The method also includes etching the second dielectric layer to form a trench that exposes the conductive pillar, and forming a conductive line in the trench to be in contact with the conductive pillar.

In some embodiments, an interconnect structure for an integrated circuit device is provided. The interconnect structure includes a conductive line layer over and electrically connected to a semiconductor device. The conductive line layer includes a lower metal line embedded in a first dielectric layer. The interconnect structure also includes a conductive pillar on and electrically connected to the lower metal line. The interconnect structure further includes a conductive line on and in contact with the conductive pillar. The conductive line and the conductive pillar are embedded in a second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an interconnect structure for an integrated circuit device, comprising:
    forming a conductive line layer over a semiconductor substrate, wherein the conductive line layer comprises a metal line;
    forming a conductive pillar on and in contact with the metal line;
    depositing a dielectric layer over the conductive line layer to cover the conductive pillar and be in direct contact with a sidewall of the conductive pillar;
    etching the dielectric layer to form a trench, wherein the conductive pillar is exposed through the trench, and opposite sidewalls of the trench are defined by sidewalls of the dielectric layer; and
    filling the trench with a first conductive material to form a conductive line.

2. The method as claimed in claim 1, wherein forming the conductive pillar comprises:
    depositing an etch stop layer on the conductive line layer;
    coating a disposable material layer on the etch stop layer;
    patterning the disposable material layer to form an opening that is aligned with the metal line;
    removing a portion of the etch stop layer to extend the opening to expose the metal line; and
    depositing a second conductive material in the opening to form the conductive pillar, wherein the conductive pillar passes through the etch stop layer.

3. The method as claimed in claim 2, wherein the disposable material layer is removed before depositing the dielectric layer, and the dielectric layer is deposited on the etch stop layer.

4. The method as claimed in claim 2, wherein the conductive pillar has a top surface that is lower than or level with a top surface of the disposable material layer.

5. The method as claimed in claim 2, wherein the first conductive material is different from the second conductive material.

6. A method of forming an interconnect structure for an integrated circuit device, comprising:
    forming a conductive line layer over a semiconductor substrate, wherein the conductive line layer comprises a metal line embedded in a first dielectric layer;
    coating a first bottom anti-reflective coating (BARC) layer over the conductive line layer;
    etching the first BARC layer to form an opening;
    forming a conductive pillar in the opening and electrically connected to the metal line, wherein forming the conductive pillar comprises:
        depositing a first conductive material on the first BARC layer and in the opening of the BARC layer; and
        removing a portion of the first conductive material on the first BARC layer using a first planarization process;
    removing the first BARC layer;
    depositing a second dielectric layer over the conductive line layer to cover the conductive pillar;

etching the second dielectric layer to form a trench that exposes the conductive pillar; and forming a conductive line in the trench to be in contact with the conductive pillar.

7. The method as claimed in claim 6, further comprising forming a first patterned photoresist layer on the first BARC layer, wherein the first BARC layer is etched using the first patterned photoresist layer as an etching mask in a dry etching process.

8. The method as claimed in claim 6, wherein forming the conductive pillar comprises depositing the first conductive material in the opening of the first BARC layer to have a top surface that is lower than a top surface of the first BARC layer.

9. The method as claimed in claim 6, wherein forming the conductive pillar further comprises etching back an upper portion of the first conductive material in the opening of the first BARC layer.

10. The method as claimed in claim 6, wherein forming the conductive line comprises:

depositing a second conductive material on the second dielectric layer and in the trench of the second dielectric layer; and removing a portion of the second conductive material on the second dielectric layer using a second planarization process.

11. The method as claimed in claim 10, wherein the first conductive material is different from the second conductive material.

12. The method as claimed in claim 6, wherein etching the second dielectric layer to form the trench comprises:

coating a second BARC layer on the second dielectric layer;

forming a second patterned photoresist layer on the second BARC layer;

etching the second BARC layer and the second dielectric layer using the second patterned photoresist layer as an etching mask in a dry etching process; and removing the second patterned photoresist layer and the second BARC layer.

13. The method as claimed in claim 6, further comprising:

depositing an etch stop layer on the conductive line layer before coating the first BARC layer; and etching a portion of the etch stop layer that is exposed through the opening of the first BARC layer before forming the conductive pillar.

14. The method as claimed in claim 6, further comprising forming an upper interconnect layer over the conductive line and the second dielectric layer, wherein the upper interconnect layer comprises an upper conductive line and an upper conductive pillar disposed under and in contact with the upper conductive line.

15. A method of forming an interconnect structure for an integrated circuit device, comprising:

forming a conductive line layer over a semiconductor substrate, wherein the conductive line layer comprises a metal line electrically connected to an active region of the semiconductor substrate;

forming an etch stop layer over the conductive line layer;

forming a bottom anti-reflective coating (BARC) layer over the etch stop layer;

forming an opening in the etch stop layer and the BARC layer to expose the metal line;

forming a conductive pillar in the opening, wherein the BARC layer is in direct contact with the conductive pillar and the etch stop layer;

removing the BARC layer;

forming a dielectric layer over the etch stop layer and the conductive pillar; and forming a conductive line on the conductive pillar in the dielectric layer, wherein the conductive line is electrically connected to the conductive pillar.

16. The method as claimed in claim 15, wherein a top width of the conductive pillar is larger than a bottom width of the conductive pillar.

17. The method as claimed in claim 16, wherein a top width of the conductive line is larger than a bottom width of the conductive line.

18. The method as claimed in claim 15, further comprising forming a contact structure layer between the substrate and the conductive line layer, wherein the contact structure layer comprises a contact electrically connected to the conductive line layer.

19. The method as claimed in claim 1, wherein a top surface of the dielectric layer in the trench is substantially level with a top surface of the conductive pillar in the trench after etching the dielectric layer.

20. The method as claimed in claim 1, wherein a bottom of the trench is defined by the dielectric layer and the conductive pillar, and the dielectric layer at the bottom of the trench is substantially level with the conductive pillar at the bottom of the trench.

* * * * *